(12) United States Patent
Iwahashi

(10) Patent No.: US 7,999,420 B2
(45) Date of Patent: Aug. 16, 2011

(54) KEY INPUT DEVICE

(75) Inventor: Toshiya Iwahashi, Daito (JP)

(73) Assignee: Funai Electric Co., Ltd., Osaka (JP)

( * ) Notice: Subject to any disclaimer, the term of this patent is extended or adjusted under 35 U.S.C. 154(b) by 166 days.

(21) Appl. No.: 12/547,153

(22) Filed: Aug. 25, 2009

(65) Prior Publication Data

US 2010/0051436 A1 Mar. 4, 2010

(30) Foreign Application Priority Data

Aug. 26, 2008 (JP) ................................. 2008-216583

(51) Int. Cl.
*H03K 17/80* (2006.01)
(52) U.S. Cl. ........................................................ 307/407
(58) Field of Classification Search .................... 307/407
See application file for complete search history.

(56) References Cited

U.S. PATENT DOCUMENTS

2007/0290891 A1 12/2007 Kato

FOREIGN PATENT DOCUMENTS

| JP | 2000-137567 | 5/2000 |
|---|---|---|
| JP | 2001-51774 | 2/2001 |
| JP | 2007-323295 | 12/2007 |

OTHER PUBLICATIONS

Patent Abstracts of Japan for Japanese Publication No. 2001-051774, Publication date Feb. 23, 2001 (1 page).
Patent Abstracts of Japan for Japanese Publication No. 2000-137567, Publication date May 16, 2000 (1 page).

*Primary Examiner* — Robert L. Deberadinis
(74) *Attorney, Agent, or Firm* — Osha Liang LLP

(57) ABSTRACT

In a voltage dividing circuit, a first circuit where only a first switch is connected, a second circuit where a first resistor and a second switch are connected in series, a third circuit where a second resistor and a third switch are connected in series and a fourth circuit where a third resistor and a fourth switch are connected in series are connected in parallel. One end of the parallel circuit is connected to a limit resistor and the other end of the parallel circuit is connected to a ground point. One switch is provided between a connecting point in one circuit and a connecting point in another circuit, and each resistor of at least two circuits is connected in parallel by said one switch.

2 Claims, 7 Drawing Sheets

FIG. 4

| OPERATED KEY | VOLTAGE VALUE (INPUT VOLTAGE V1) | KEY INFORMATION |
|---|---|---|
| NONE | V0 | KEY OFF |
| KEY1 | 0 | POWER |
| KEY2 | V0*R2/(R1+R2) | SETUP |
| KEY3 | V0*R3/(R1+R3) | INPUT SELECT |
| KEY4 | V0*R4/(R1+R4) | ENTER |
| KEY5 | V0*R2*R3/(R1*R2+R1*R3+R2*R3) | CH UP |
| KEY6 | V0*R2*R4/(R1*R2+R1*R4+R2*R4) | CH DOWN |
| KEY7 | V0*R3*R4/(R1*R3+R1*R4+R3*R4) | VOLUME UP |
| KEY8 | V0*R2*R3*R4/(R1*R2*R3+R1*R2*R4+R1*R3*R4+R2*R3*R4) | VOLUME DOWN |

FIG. 5

| OPERATED KEY | VOLTAGE VALUE (Vl) | KEY INFORMATION |
|---|---|---|
| NONE | V0 | KEY OFF |
| KEY1 | 0 | POWER |
| KEY2 | V0*R2/(R1+R2) | SETUP |
| KEY3 | V0*R3/(R1+R3) | INPUT SELECT |
| KEY4 | V0*R4/(R1+R4) | ENTER |
| KEY5 | V0*R5/(R1+R5) | CH UP |
| KEY6 | V0*R2*R3/(R1*R2+R1*R3+R2*R3) | CH DOWN |
| KEY7 | V0*R2*R4/(R1*R2+R1*R4+R2*R4) | VOLUME UP |
| KEY8 | V0*R2*R5/(R1*R2+R1*R5+R2*R5) | VOLUME DOWN |
| KEY9 | V0*R3*R4/(R1*R3+R1*R4+R3*R4) | MUTE |
| KEY10 | V0*R3*R5/(R1*R3+R1*R5+R3*R5) | ELECTRONIC PROGRAM GUIDE |
| KEY11 | V0*R4*R5/(R1*R4+R1*R5+R4*R5) | TILT UP |
| KEY12 | V0*R2*R3*R4/(R1*R2*R3+R1*R2*R4+R1*R3*R4+R2*R3*R4) | TILT DOWN |
| KEY13 | V0*R2*R3*R5/(R1*R2*R3+R1*R2*R5+R1*R3*R5+R2*R3*R5) | TURN RIGHT |
| KEY14 | V0*R2*R4*R5/(R1*R2*R4+R1*R2*R5+R1*R4*R5+R2*R4*R5) | TURN LEFT |
| KEY15 | V0*R3*R4*R5/(R1*R3*R4+R1*R3*R5+R1*R4*R5+R2*R4*R5) | BRIGHTNESS UP |
| KEY16 | V0*R2*R3*R4*R5/(R1*R2*R3*R4+R1*R2*R3*R5+R1*R2*R4*R5+R1*R3*R4*R5) | BRIGHTNESS DOWN |

KEY INPUT DEVICE

TECHNICAL FIELD

The present invention relates to a key input device identifying an operated key in a plurality of keys.

BACKGROUND ART

Conventional electronic equipment has a number of keys for performing various setup and switching of operation with respect to the equipment at a front or a side thereof. In such electronic equipment, when any key is operated, a signal (voltage signal) corresponding to the key is supplied to, for example, a microcomputer provided in the electronic equipment. The microcomputer identifies the operated key based on the supplied signal (voltage signal) and controls the operation of the electronic equipment based on a result of identification.

Patent literatures No. 1 to No. 3 mentioned below describe common means for identifying the operated key based on the signal (voltage signal) supplied to the microcomputer.

Patent literature No. 1 describes a key matrix circuit. In this circuit, when any selection key is pressed in a keyboard with a plurality of selection keys arranged in a matrix, two pairs of voltage levels corresponding to the pressed selection key are detected, and the pressed selection key is identified based on the detection result.

Patent literature No. 2 describes a key switch circuit comprising a plurality of switch groups and a hold switch for holding an operation command by a key switch. The key switch circuit is provided with a hold circuit. When no key switch in the key switch groups is operated, the hold circuit holds a voltage at a particular value different from a value of an output voltage generated in the key switch circuit, whereby it is capable of determining whether the key switch circuit is connected or not, without increasing the number of input ports for such as CPU (Central Processing Unit).

Patent literature No. 3 describes a key input device. In this key input device, each one end of a plurality of resistor string parts to produce the resistance value corresponding to the input key is connected electrically to a power supply, and a selection part electrically connects one of the plurality of resistor string parts to ground in response to a selection command from a control unit. Further, one of the resistor string parts corresponding to the selection command from the control unit is electrically connected to the power supply and, when a value of the voltage corresponding to the input key at the resistor string part is generated at a connecting node, the control unit identifies the input key based on the value of the voltage generated at the connecting node and the selection command given to the selection part.

CITATION LIST

Patent Literature

Patent Literature 1: Japanese Laid-Open Patent Publication No. 2001-51774
Patent Literature 2: Japanese Laid-Open Patent Publication No. 2000-137567
Patent Literature 3: Japanese Laid-Open Patent Publication No. 2007-323295

SUMMARY OF INVENTION

Technical Problems

In the circuits and the device described in the above patent literatures, a plurality of resistors are connected in series as means for identifying the operated key based on the signal (voltage signal) supplied to the microcomputer, and the operated key is identified based on a divided voltage according to the series-connected resistors.

Accordingly, if the number of keys to be identified is increased, the number of resistors required for identifying keys should be also increased. This causes a problem that the cost increases as the number of keys increases. In addition, increase in the number of resistors causes enlargement of circuit and more power consumption.

In view of the above problems, the present invention aims to provide a key input device capable of reducing the cost by suppressing the increase in the number of resistors even if the number of keys to be identified increases.

Solution to Problems

A key input device according to the present invention includes a plurality of keys, a limit resistor whose one end is connected to a power supply and a voltage dividing circuit connected to the other end of the limit resistor to generate different voltages corresponding to each key when any of the plurality of keys is operated, and identifies the operated key based on the voltage generated by the voltage dividing circuit. The voltage dividing circuit includes a plurality of resistors and a plurality of switches each of which is corresponding to each of the plurality of keys. The plurality of switches are composed of a first switch group and a second switch group. A plurality of circuits each of which has one resistor out of the plurality of resistors and one switch in the first switch group are provided, where the resistor and the switch are connected in series. The plurality of circuits are connected in parallel so that one end thereof is connected to the limit resistor and the other end thereof is grounded. Each circuit in the parallel-connected circuits has a connecting point between the resistor and the switch, and one switch in the second switch group is connected between the connecting point in one circuit and the connecting point in another circuit, and each resistor of at least two circuits is connected in parallel by said one switch.

In the above configuration, the circuits having the switch (first group) and the resistor connected in series are connected in parallel, and the switch (second group) is arranged between the connecting points of the switch (first group) and the resistor in each circuit. Thus, compared to the voltage dividing circuit where the plurality of resistors are connected in series, it is possible to generate more various divided voltages of different voltage values. Therefore, if a voltage dividing circuit is configured with the same number of resistors, the device of the present invention can identify more keys than conventional devices. Accordingly, it is possible to reduce the cost by suppressing the increase in the number of resistors even if the number of keys increases.

In the key input device of the present invention, the plurality of resistors may have different resistance values with each other.

According to this, the voltage dividing circuit can generate divided voltages of different values easily, thereby preventing the misidentification of keys due to the voltage values being close to each other.

Advantageous Effects of Invention

According to the present invention, it is possible to provide the key input device capable of reducing the cost by suppressing the increase in the number of resistors, even if the number of keys to be identified increases.

BRIEF DESCRIPTION OF DRAWINGS

FIG. 4 is a diagram showing an example of a conversion table.

FIG. 5 is a diagram showing another example of a conversion table.

DESCRIPTION OF EMBODIMENTS

An embodiment of the present invention will be described hereinafter with reference to the drawings.

Figure 1:
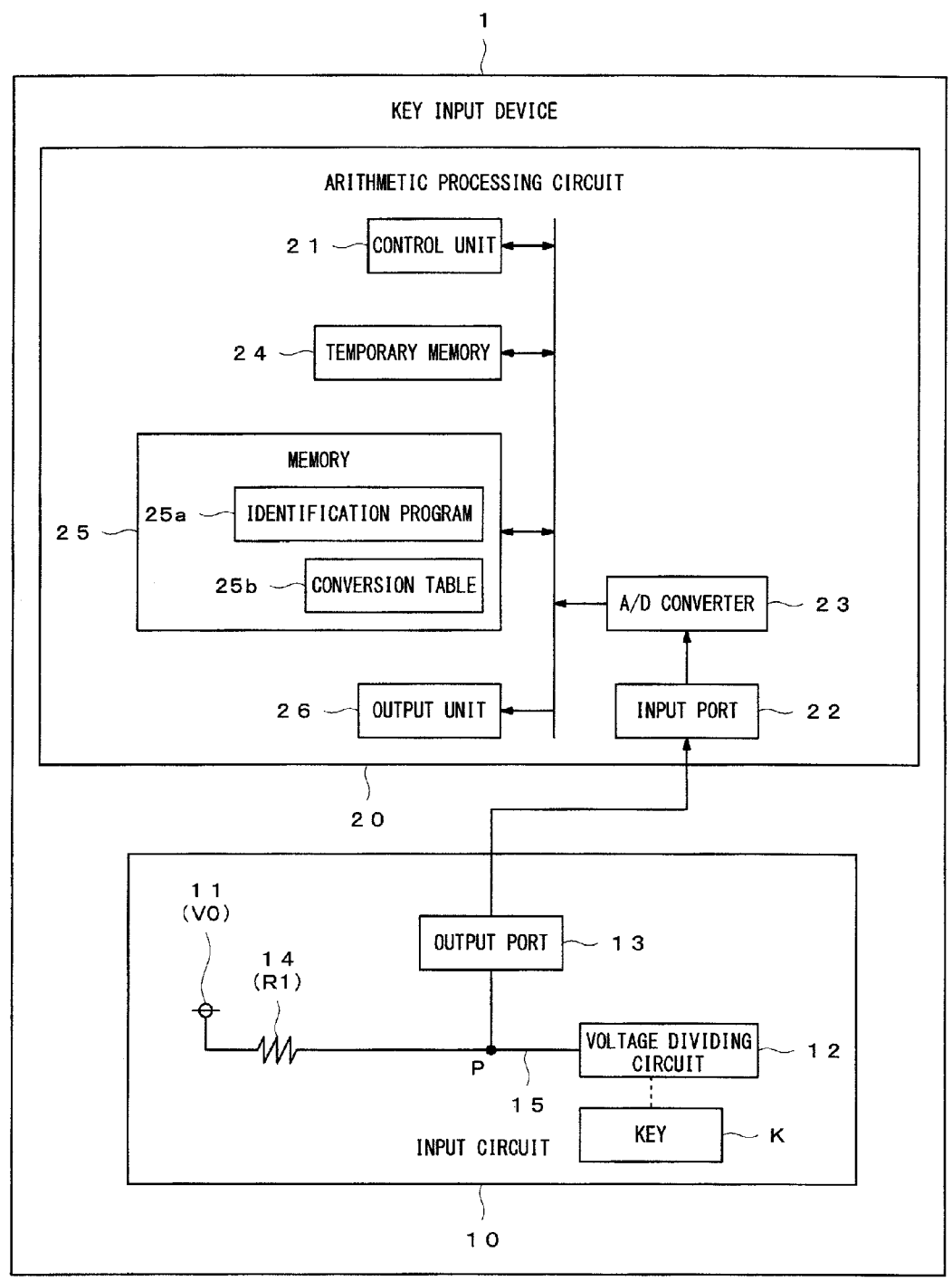
FIG. 1 is a block diagram showing a configuration of a key input device.

First, a configuration of the general key input device will be described with a block diagram of FIG. 1. As illustrated in FIG. 1, a key input device 1 comprises an input circuit 10 having a plurality of keys and an arithmetic processing circuit 20 for identifying keys to which the input operation is performed based on a voltage signal supplied from the input circuit 10.

The input circuit 10 comprises a key K, a power supply 11, a voltage dividing circuit 12, an output port 13 outputting a voltage signal, and a limit resistor 14 whose one end is connected to the power supply 11 and the other end is connected to the voltage dividing circuit 12 through a connecting line 15. The output port 13 is connected to a connecting point P of the limit resistor 14 and the voltage dividing circuit 12. The voltage value of the power supply 11 is V0 and the resistance value of the limit resistor 14 is R1.

The arithmetic processing circuit 20 is an LSI (Large Scale Integration) and includes, for example, a control unit 21, an input port 22, an A/D converter 23, a temporary memory 24, a memory 25 and the output unit 26.

The control unit 21 is a CPU (Central Processing Unit), and generally controls each part of the arithmetic processing circuit 20.

The input port 22 receives a voltage signal supplied from the output port 13 of the input circuit 10, and then supplies the signal to the A/D converter 23. The A/D converter 23 converts the input voltage signal from an analog signal to a digital signal.

The temporary memory 24 is, for example, a RAM (Random Access Memory) and is provided with a storage area to store the voltage signal outputted from the A/D converter 23 temporarily.

The memory 25 is, for example, a ROM (Read Only Memory) and includes various programs which are executed by the control unit 21 and data which is read when the various programs are executed.

Specifically, the memory 25 includes a identification program 25a which performs key identification based on the voltage signal (voltage value) supplied from the input circuit 10, and a conversion table 25b recording the voltage signal (voltage value) supplied to the input port 22 and the kind of the key to be identified so that they are associated with each other. The conversion table 25b will be described below in detail.

The output unit 26 supplies information regarding the key (hereinafter, described as "key information") identified by execution of the identification program 25a to a device (not illustrated) such as a DVD (Digital Versatile Disc) player connected with the key input device 1.

In the key input device 1 configured as above, when identification of the key to which the input operation is performed, a voltage which is previously set for every key is generated by the voltage dividing circuit 12. The generated divided voltage i.e. a voltage signal is supplied to the arithmetic processing circuit 20 through a connecting line 15 and the output port 13. Then in the arithmetic processing circuit 20, under control of the control unit 21, key identification based on the voltage signal inputted to the input port 22 is executed with the identification program 25a and the conversion table 25b.

Figure 6:
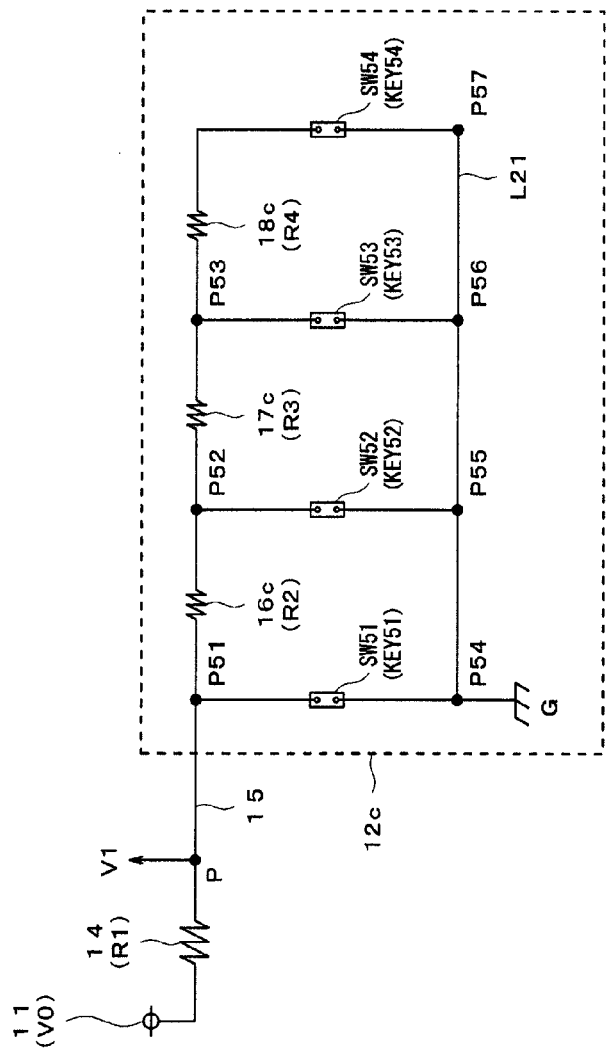
FIG. 6 is a diagram showing an example of a configuration of a conventional voltage dividing circuit.
Figure 7:
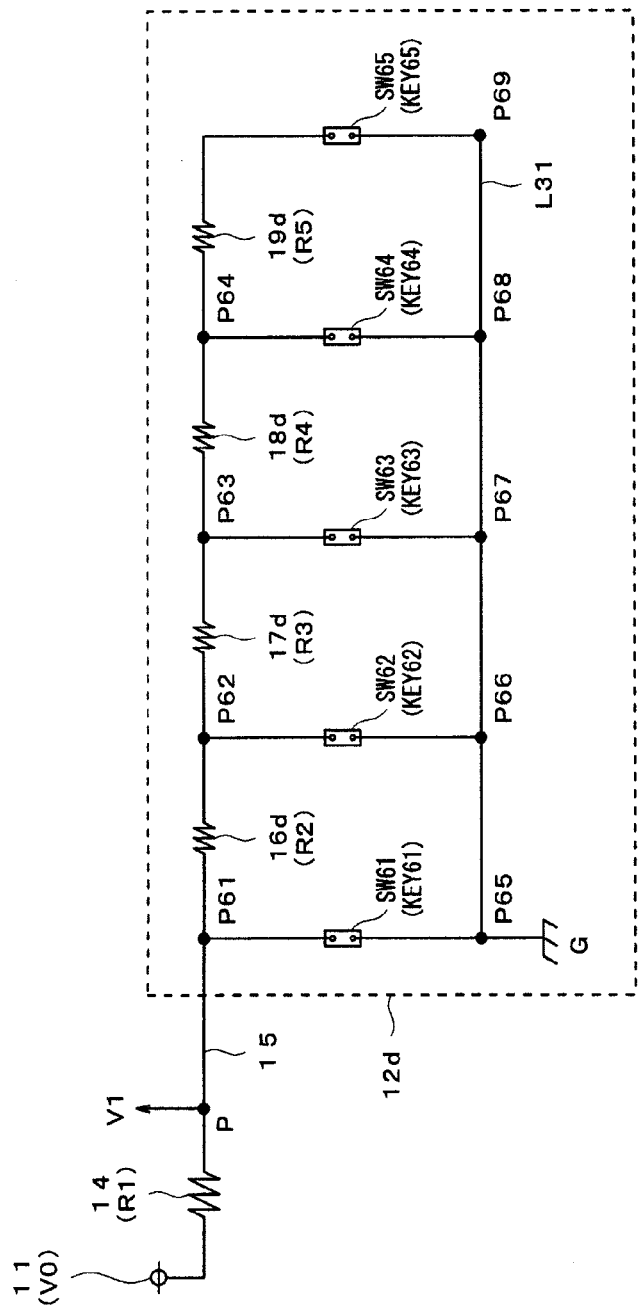
FIG. 7 is another example of a configuration of a conventional voltage dividing circuit.

Here, a voltage dividing circuit 12c indicated in FIG. 6 and a voltage dividing circuit 12d indicated in FIG. 7 are taken as conventional examples of the voltage dividing circuit 12.

First, in FIG. 6, the voltage dividing circuit 12c includes three resistors 16c to 18c and four switches (SW51 to SW54) corresponding to, respectively, four keys (KEY51 to KEY54) to which the input operation is performed. Resistance values of the resistors 16c to 18c are R2 to R4, respectively.

In the voltage dividing circuit 12c, the resistors 16c to 18c are connected in series. One end of the switch SW51 is connected to a connecting point P51 of the connecting line 15 and the resistor 16c. Similarly, one end of the switch SW52 is connected to a connecting point P52 of the resistor 16c and the resistor 17c, one end of the switch SW53 is connected to a connecting point P53 of the resistor 17c and the resistor 18c, and one end of the switch SW54 is connected to an end of the resistor 18c.

The other end of the switch SW51 is connected to a connecting point P54 provided on one end of a ground line L21 connecting the switches (SW51 to SW54) in common. Similarly, the other end of the switch SW52 is connected to a connecting point P55 provided on the ground line L21, the other end of the switch SW53 is connected to a connecting point P56 provided on the ground line L21, and the other end of the switch SW54 is connected to a connecting point P57 provided on the other end of the ground line L21.

Further, since the connecting point P54 provided on one end of the ground line L21 is also connected to a ground point G, the other ends of the switches (SW51 to SW54) are connected to the ground point G in common through the ground line L21.

In the above configuration, when the KEY 51 is operated, for example, one end of the connecting line 15 and the ground point G are short-circuited by the switch SW51 connected between the connecting points P51 and P54. Therefore, a divided voltage generated in the voltage dividing circuit 12c, that is, an input voltage V1 which is supplied from the connecting point P to the output port 13 (FIG. 1) is indicated as V1=0.

Similarly, when the KEY 52 is operated, for example, one end of the resistor 16c and the ground point G are short-circuited by the switch SW52 connected between the connecting points P52 and P55. Therefore, the input voltage V1 is indicated as V1=V0·R2/(R1+R2).

When the KEY 53 is operated, one end of the resistor 17c and the ground point G are short-circuited by the switch SW53 connected between the connecting points P53 and P56. Therefore, the input voltage V1 is indicated as V1=V0·(R2+R3)/(R1+R2+R3).

When the KEY 54 is operated, one end of the resistor 18c and the ground point G are short-circuited by the switch SW54 connected between an end of the resistor 18c and the connecting point P57. Therefore, the input voltage V1 is indicated as V1=V0·(R2+R3+R4)/(R1+R2+R3+R4).

As described above, in the voltage dividing circuit 12c, four kinds of divided voltages of different values are generated by short-circuiting the predetermined portion in the circuit 12c with one of the switches SW51 to SW54 by key operation. And the divided voltages generated in the circuit 12c are supplied to the output port 13 through the connecting point P as the input voltage V1.

Next, in FIG. 7, the voltage dividing circuit 12d includes four resistors 16d to 19d and five switches (SW61 to SW65) corresponding to, respectively, five keys (KEY61 to KEY65) to which the input operation is performed. Resistance values of the resistors 16d to 19d are R2 to R5, respectively.

In the voltage dividing circuit 12d, the resistors 16d to 19d are connected in series. One end of the switch SW61 is connected to a connecting point P61 of the connecting line 15 and the resistor 16d. Similarly, one end of the switch SW62 is connected to a connecting point P62 of the resistors 16d and 17d, one end of the switch SW63 is connected to a connecting point P63 of the resistors 17d and 18d, one end of the switch SW64 is connected to a connecting point P64 of the resistors 18d and 19d, and one end of the switch SW65 is connected to an end of the resistor 19d.

The other end of the switch SW61 is connected to a connecting point P65 provided on one end of a ground line L31 connecting the switches (SW61 to SW65) in common. Similarly, the other end of the switch SW62 is connected to a connecting point P66 provided on the ground line L31, the other end of the switch SW63 is connected to a connecting point P67 provided on the ground line L31, the other end of the switch SW64 is connected to a connecting point P68 provided on the ground line L31, and the other end of the switch SW65 is connected to a connecting point P69 provided on the other end of the ground line L31.

Further, since the connecting point P65 provided on one end of the ground line L31 is also connected to the ground point G, the other ends of the switches (SW61 to SW65) are connected to the ground point G in common through the ground line L31.

In the above configuration, when the KEY61 is operated, for example, one end of the connecting line 15 and the ground point G are short-circuited by the switch SW61 connected between the connecting points P61 and P65. Therefore, a divided voltage generated in the voltage dividing circuit 12d, that is, an input voltage V1 supplied from the connecting point P to the output port 13 is indicated as V1=0.

When the KEY62 is operated, one end of the resistor 16d and the ground point G are short-circuited by the switch SW62 connected between the connecting points P62 and P66. Therefore, the input voltage V1 is indicated as V1=V0·R2/(R1+R2).

When the KEY63 is operated, one end of the resistor 17d and the ground point G are short-circuited by the switch SW63 connected between the connecting points P63 and P67. Therefore, the input voltage V1 is indicated as V1=V0·(R2+R3)/(R1+R2+R3) When the KEY64 is operated, one end of the resistor 18d and the ground point G are short-circuited by the switch SW64 connected between the connecting points P64 and P68. Therefore, the input voltage V1 is indicated as V1=V0·(R2+R3+R4)/(R1+R2+R3+R4).

When the KEY65 is operated, an end of the resistor 19d and the ground point G are short-circuited by the switch SW65 connected between the end of the resistor 19d and the connecting point P69. Therefore, the input voltage V1 is indicated as V1=V0·(R2+R3+R4+R5)/(R1+R2+R3+R4+R5).

As described above, in the voltage dividing circuit 12d, five kinds of divided voltages of different values are generated by short-circuiting the predetermined portion in the circuit 12d with one of the switches SW61 to SW65 by key operation. And the divided voltages generated in the circuit 12d are supplied to the output port 13 through the connecting point P as the input voltage V1.

When no key is operated in the voltage dividing circuits 12c and 12d, the above-mentioned divided voltages are not generated in each voltage dividing circuit. Therefore, the input voltage V1 having voltage value of V0 is supplied from the power supply 11 to the output port 13 through the limit resistor 14.

Consequently, if the voltage dividing circuit 12 in FIG. 1 is the conventional voltage dividing circuit 12c (FIG. 6) having three resistors 16c to 18c, five kinds of input voltages V1 of different values are supplied to the arithmetic processing circuit 20 through the output port 13. Therefore, the arithmetic processing circuit 20 can identify five different kinds of keys by performing a predetermined process based on the input voltage V1.

Similarly, if the voltage dividing circuit 12 in FIG. 1 is the conventional voltage dividing circuit 12d (FIG. 7) having four resistors 16d to 19d, six kinds of input voltages V1 of different values are supplied to the arithmetic processing circuit 20 through the output port 13. Therefore, the arithmetic processing circuit 20 can identify six different kinds of keys by performing a predetermined process based on the input voltage V1.

However, in such configuration as the voltage dividing circuits 12c and 12d where resistors are connected in series, if the number of keys to be identified increases, a large number of resistors should be provided and the cost increases as the number of components increases.

Figure 2:
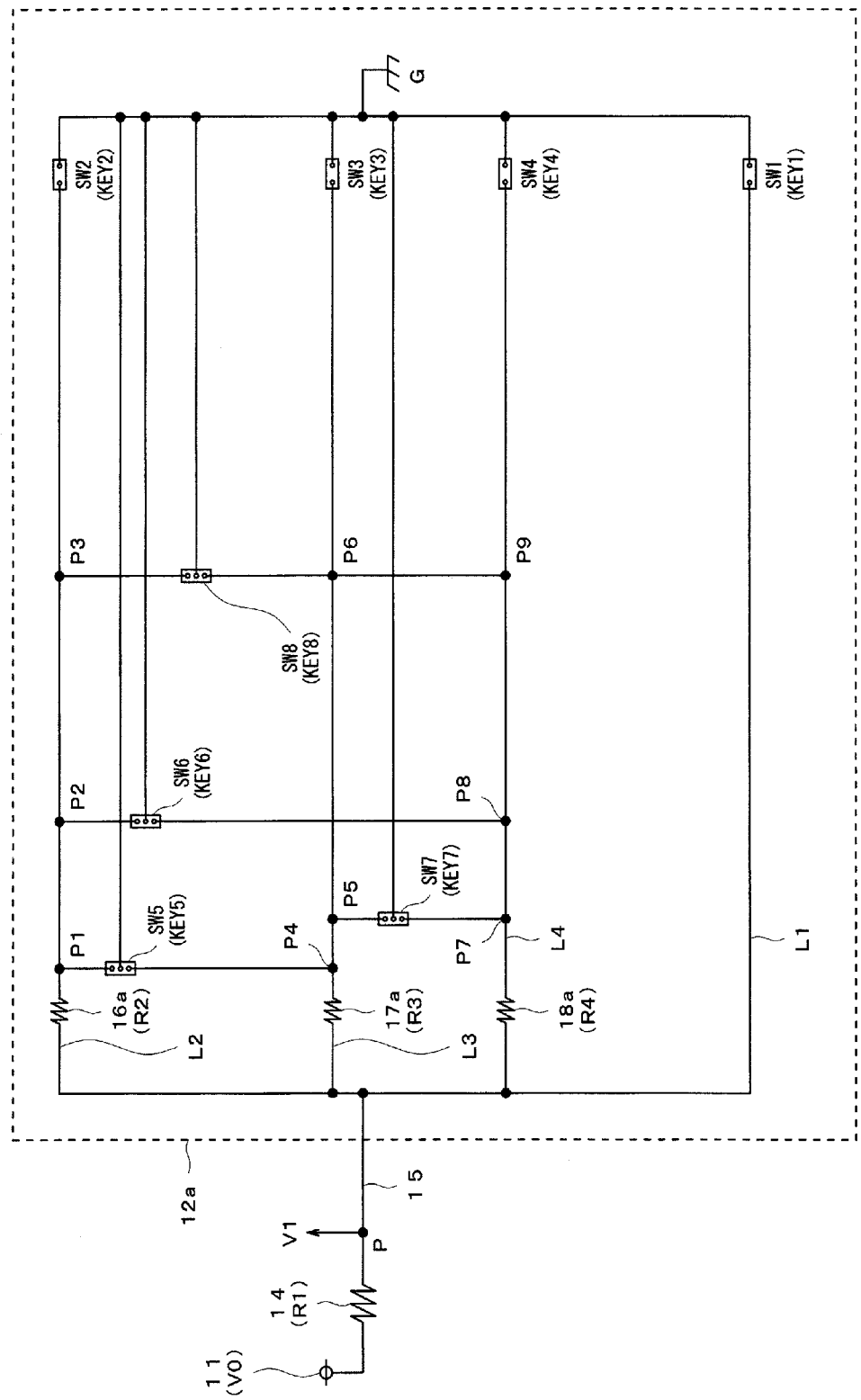
FIG. 2 is a diagram showing an example of a configuration of a voltage dividing circuit according to an embodiment of the present invention.
Figure 3:
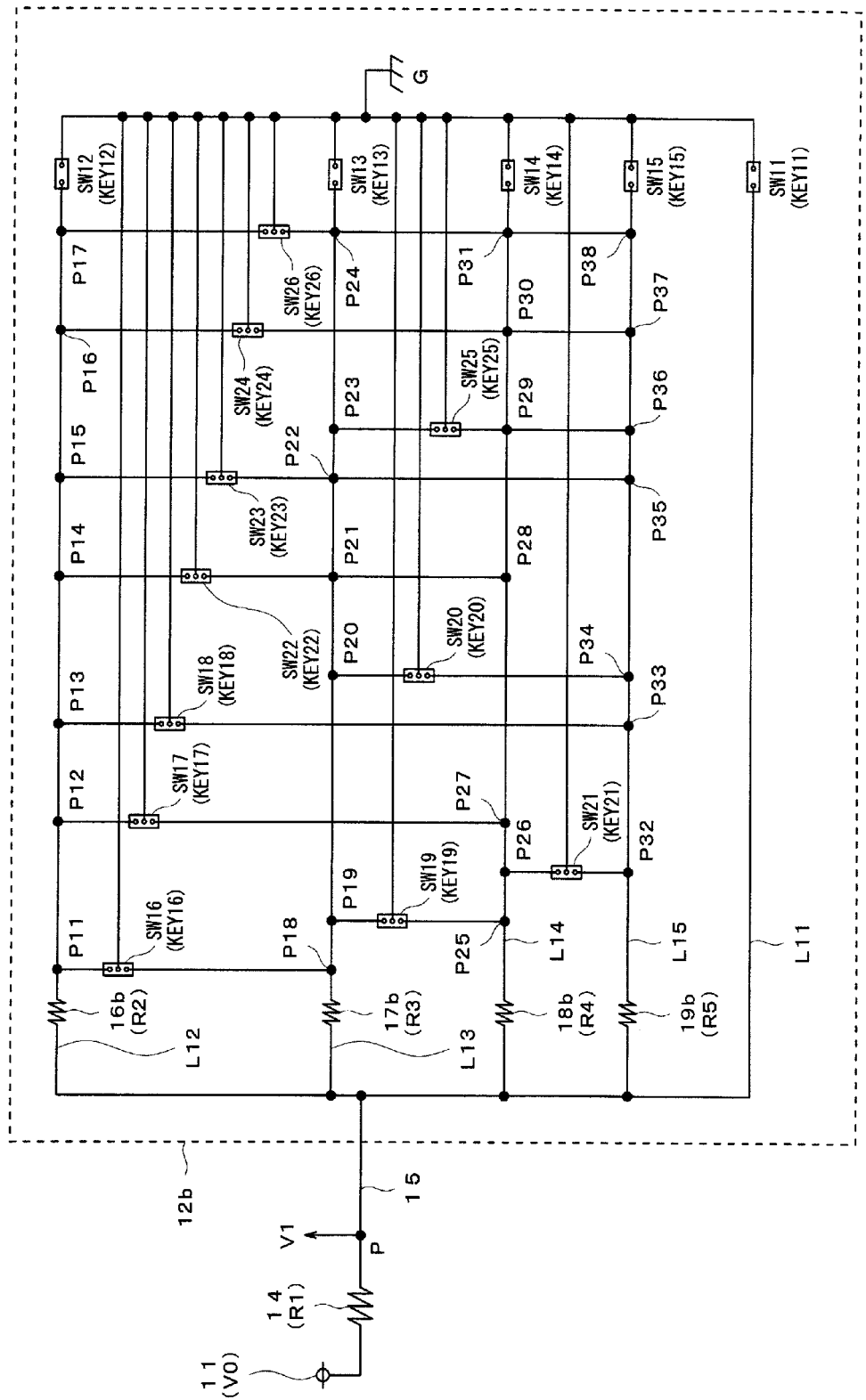
FIG. 3 is a diagram showing another example of a configuration of a voltage dividing circuit according to an embodiment of the present invention.

Therefore, in the present embodiment, the circuit configurations such as the voltage dividing circuit 12a in FIG. 2 and the voltage dividing circuit 12b in FIG. 3 are employed to solve the above problem.

First, the voltage dividing circuit 12a in FIG. 2 includes three resistors, i.e. a resistor 16a whose resistance value is R2, a resistor 17a whose resistance value is R3 and a resistor 18a whose resistance value is R4. The voltage dividing circuit 12a is composed of a circuit L1 where only a switch SW1 is connected, a circuit L2 where the resistor 16a and a switch SW2 are connected in series, a circuit L3 where the resistor 17a and a switch SW3 are connected in series, and a circuit L4 where the resistor 18a and a switch SW4 are connected in series. The resistance values R2 to R4 are different from each other. For example, R2=0.8 kΩ, R3=1.5 kΩ and R4=3.0 kΩ. With such different resistance values, divided voltages of different voltage values can be easily generated.

Specifically, the circuits L1 to L4 are connected in parallel. One end of this parallel circuit is connected to the limit resistor 14 through the connecting line 15, and the other end of the parallel circuit is connected to the ground point G.

Also, between the resistor 16a and the switch SW2 of the circuit L2, three connecting points P1 to P3 are provided in order from the resistor 16a side. Similarly, between the resistor 17a and the switch SW3 of the circuit L3, three connecting points P4 to P6 are provided in order from the resistor 17a side, and between the resistor 18a and the switch SW4 of the circuit L4, three connecting points P7 to P9 are provided in order from the resistor 18a side.

Further, a switch SW5 for short-circuiting the resistors 16a and 17a is provided between the connecting points P1 and P4. Similarly, a switch SW6 for short-circuiting the resistors 16a and 18a is provided between the connecting points P2 and P8, a switch SW7 for short-circuiting the resistors 17a and 18a is provided between the connecting points P5 and P7, and a switch SW8 for short-circuiting the resistors 16a, 17a and 18a is provided between the connecting points P3 and P6 (P9).

The above four switches SW5 to SW8 have three contacts respectively and the middle contacts thereof are connected to the ground point G in common.

In the voltage dividing circuit 12a having above-described configuration, the switches SW1 to SW8 correspond to, respectively, eight keys (KEY1 to KEY8) to which the input operation is performed. The switches SW1 to SW4 compose the first switch group in the present invention and the switches SW5 to SW8 compose the second switch group in the present invention.

Thus, when the KEY1 is operated, for example, one end of the connecting line 15 and the ground point G are short-circuited by the switch SW1. Therefore, a divided voltage generated in the voltage dividing circuit 12a, that is, the input voltage V1 supplied from the connecting point P to the output port 13 is indicated as V1=0.

When the KEY2 is operated, one end of the resistor 16a and the ground point G are short-circuited by the switch SW2. Therefore, the input voltage V1 is indicated as $V1=V0 \cdot R2/(R1+R2)$.

When the KEY3 is operated, one end of the resistor 17a and the ground point G are short-circuited by the switch SW3. Therefore, the input voltage V1 is indicated as $V1=V0 \cdot R3/(R1+R3)$.

When the KEY4 is operated, one end of the resistor 18a and the ground point G are short-circuited by the switch SW4. Therefore, the input voltage V1 is indicated as $V1=V0 \cdot R4/(R1+R4)$.

When the KEY5 is operated, one end of the resistor 16a and one end of the resistor 17a are short-circuited by the switch SW5 and connected to the ground point G through the switch SW5. Therefore, the input voltage V1 is indicated as $V1=V0 \cdot R2 \cdot R3/(R1 \cdot R2+R1 \cdot R3+R2 \cdot R3)$.

When the KEY6 is operated, one end of the resistor 16a and one end of the resistor 18a are short-circuited by the switch SW6 and connected to the ground point G through the switch SW6. Therefore, the input voltage V1 is indicated as $V1=V0 \cdot R2 \cdot R4/(R1 \cdot R2+R1 \cdot R4+R2 \cdot R4)$.

When the KEY7 is operated, one end of the resistor 17a and one end of the resistor 18a are short-circuited by the switch SW7 and connected to the ground point G through the switch SW7. Therefore, the input voltage V1 is indicated as $V1=V0 \cdot R3 \cdot R4/(R1 \cdot R3+R1 \cdot R4+R3 \cdot R4)$.

When the KEY8 is operated, one end of the resistor 16a, one end of the resistor 17a and one end of the resistor 18a are short-circuited by the switch SW8 and connected to the ground point G through the switch SW8. Therefore, the input voltage V1 is indicated as $V1=V0 \cdot R2 \cdot R3 \cdot R4/(R1 \cdot R2 \cdot R3+R1 \cdot R2 \cdot R4+R1 \cdot R3 \cdot R4+R2 \cdot R3 \cdot R4)$.

As described above, in the voltage dividing circuit 12a, eight kinds of divided voltages of different values are generated by short-circuiting the predetermined portion in the circuit 12a with one of the switches SW1 to SW8 by key operation. And the divided voltages generated in the voltage dividing circuit 12a are supplied to the output port 13 through the connecting point P as the input voltage V1.

Next, the voltage dividing circuit 12b in FIG. 3 includes four resistors, i.e. a resistor 16b whose resistance value is R2, a resistor 17b whose resistance value is R3, a resistor 18b whose resistance value is R4 and a resistor 19b whose resistance value is R5. The voltage dividing circuit 12b is composed of a circuit L11 where only a switch SW11 is connected, a circuit L12 where the resistor 16b and a switch SW12 are connected, a circuit L13 where the resistor 17b and a switch SW13 are connected, a circuit L14 where the resistor 18b and a switch SW14 are connected, and a circuit L15 where the resistor 19b and a switch SW15 are connected.

Specifically, the circuits L11 to L15 are connected in parallel. One end of this parallel circuit is connected to the limit resistor 14 through the connecting line 15, and the other end of the parallel circuit is connected to the ground point G.

Also, between the resistor 16b and the switch SW12 of the circuit L12, seven connecting points P11 to P17 are provided in order from the resistor 16b side. Similarly, between the resistor 17b and the switch SW13 of the circuit L13, seven connecting points P18 to P24 are provided in order from the resistor 17b side. Between the resistor 18b and the switch SW14 of the circuit L14, seven connecting points P25 to P31 are provided in order from the resistor 18b side. Between the resistor 19b and the switch SW15 of the circuit L15, seven connecting points P32 to P38 are provided in order from the resistor 19b side.

Further, between the connecting points P11 and P18, a switch SW16 for short-circuiting the resistors 16b and 17b is provided. Similarly, between the connecting points P12, and P27, a switch SW17 for short-circuiting the resistors 16b and 18b is provided, and between the connecting points P13 and P33, a switch SW18 for short-circuiting the resistors 16b and 19b is provided.

Between the connecting points P19 and P25, a switch SW19 for short-circuiting the resistors 17b and 18b is provided. Between the connecting points P20 and P34, a switch SW20 for short-circuiting the resistors 17b and 19b is provided. Between the connecting points P26 and P32, a switch SW21 for short-circuiting the resistors 18b and 19b is provided.

Between the connecting points P14 and P21 (P28), a switch SW22 for short-circuiting the resistors 16b, 17b and 18b is provided. Between the connecting points P15 and P22 (P35), a switch SW23 for short-circuiting the resistors 16b, 17b and 19b is provided.

Between the connecting points P16 and P30 (P37), a switch SW24 for short-circuiting the resistors 16b, 18b and 19b is provided. Between the connecting points P23 and P29 (P36), a switch SW25 for short-circuiting the resistors 17b, 18b and 19b is provided.

Finally, between the connecting points P17 and P24 (P31, P38), a switch SW26 for short-circuiting the resistors 16b, 17b, 18b and 19b is provided.

The above eleven switches SW16 to SW26 have three contacts respectively and the middle contacts thereof are connected to the ground point G in common.

In the voltage dividing circuit 12b having above-described configuration, the switches SW11 to SW26 correspond to, respectively, sixteen keys (KEY11 to KEY26) to which the input operation is performed. The switches SW11 to SW15 compose the first switch group in the present invention and the switches SW16 to SW26 compose the second switch group in the present invention.

Thus, when the KEY11 is operated, for example, one end of the connecting line 15 and the ground point G are short-circuited by the switch SW11. Therefore, the divided voltage generated in the voltage dividing circuit 12b, that is, the input voltage V1 supplied from the connecting point P to the output port 13 is indicated as V1=0.

Similarly, when the KEY12 is operated, for example, one end of the resistor 16b and the ground point G are short-circuited by the switch SW12. Therefore, the input voltage V1 is indicated as $V1=V0 \cdot R2/(R1+R2)$.

Similarly, when any key of the KEY13 to KEY26 is operated, the predetermined input voltage V1 is generated according to the circuit state produced by short-circuiting a resistor (resistors) with the switch corresponding to the operated key.

For example, when the KEY16 is operated, one end of the resistor 16b and one end of the resistor 17b are short-circuited by the switch SW16 and connected to the ground point G through the switch SW16. Therefore, the input voltage V1 is indicated as $V1=V0\cdot R2\cdot R3/(R1\cdot R2+R1\cdot R3+R2\cdot R3)$.

Further, when the KEY22 is operated, for example, one end of the resistor 16b, one end of the resistor 17b and one end of the resistor 18b are short-circuited by the switch SW22 and connected to the ground point G through the switch SW22. Therefore, the input voltage V1 is indicated as $V1=V0\cdot R2\cdot R3\cdot R4/(R1\cdot R2\cdot R3+R1\cdot R2\cdot R4+R1\cdot R3\cdot R4+R2\cdot R3\cdot R4)$.

As described above, in the voltage dividing circuit 12b, sixteen kinds of divided voltages of different values are generated by short-circuiting the predetermined portion in the circuit 12b with one of the switches SW11 to SW26 by key operation. And the divided voltages generated in the voltage dividing circuit 12b are supplied to the output port 13 through the connecting point P as the input voltage V1.

When no key is operated in the voltage dividing circuits 12a and 12b, the above-mentioned divided voltages are not generated in each voltage dividing circuit. Therefore, the input voltage V1 having voltage value of V0 is supplied from the power supply 11 to the output port 13 through the limit resistor 14.

Consequently, if the voltage dividing circuit 12 in FIG. 1 is the voltage dividing circuit 12a (FIG. 2) including three resistors 16a to 18a, nine kinds of input voltages V1 of different values are supplied to the arithmetic processing circuit 20 through the output port 13. Therefore, the arithmetic processing circuit 20 can identify nine different kinds of keys by performing a predetermined process based on the input voltages V1. Accordingly, compared to the circuit 12c in FIG. 6 which can identify only five kinds of keys with three resistors, it is capable of identifying more keys, even though the voltage dividing circuit 12a has just the same three resistors as the circuit 12c in FIG. 6.

Similarly, if the voltage dividing circuit 12 in FIG. 1 is the voltage dividing circuit 12b (FIG. 3) including four resistors 16b to 19b, seventeen kinds of input voltages V1 of different values are supplied to the arithmetic processing circuit 20 through the output port 13. Therefore, the arithmetic processing circuit 20 can identify seventeen different kinds of keys by performing a predetermined process based on the input voltages V1. Accordingly, compared to the circuit 12d in FIG. 7 which can identify only six kinds of keys with four resistors, it is capable of identifying more keys, even though the voltage dividing circuit 12b has just the same four resistors as the circuit 12d in FIG. 7.

Next, the key identification will be described in detail. The key identification is executed using the conversion table 25b (FIG. 1). Specifically, if the voltage dividing circuit 12 is the above-described voltage dividing circuit 12a, the conversion table 25b has a table format illustrated in FIG. 4. If the voltage dividing circuit 12 is the above-described voltage dividing circuit 12b, the conversion table 25b has a table format illustrated in FIG. 5.

In the conversion table 25b in FIG. 4, column 25e indicates keys to which the input operation is performed (hereinafter, described as "operation key") and column 25f indicates a divided voltage generated in the voltage dividing circuit 12a when a corresponding key is operated, that is, the voltage value of the input voltage V1 supplied to the output port 13.

Column 25g indicates key information outputted to the output unit 26 by the identification program 25a based on each voltage value of column 25f.

Similarly, in the conversion table 25b in FIG. 5, column 25q indicates the operation key, column 25r indicates the divided voltage generated in the voltage dividing circuit 12b when a corresponding key is operated, that is, the voltage value of the input voltage V1 supplied to the output port 13. Column 25s indicates key information outputted to the output unit 26 by the identification program 25a based on the each voltage value of column 25r.

When the voltage value of the input voltage V1 which is supplied from the input circuit 10 having the voltage dividing circuit 12a to the arithmetic processing circuit 20 is, for example, $V1=V0\cdot R2\cdot R3/(R1\cdot R2+R1\cdot R3+R2\cdot R3)$, the identification program 25a executes the key identification under control of the control unit 21 with reference to the conversion table 25b in FIG. 4 and determines that the KEY5, which is corresponding to the above voltage value V1, has been operated. Then, the identification program 25a outputs "CH UP", which is key information of the KEY5, to the output unit 26.

Similarly, when the voltage value of the input voltage V1 which is supplied from the input circuit 10 having the voltage dividing circuit 12b to the arithmetic processing circuit 20 is, for example, $V1=V0\cdot R2\cdot R3\cdot R4/(R1\cdot R2\cdot R3+R1\cdot R2\cdot R4+R1\cdot R3\cdot R4+R2\cdot R3\cdot R4)$, the identification program 25a executes the key identification under control of the control unit 21 with reference to the conversion table 25b in FIG. 5 and determines that the KEY12, which is corresponding to the above voltage value V1, has been operated. Then, the identification program 25a outputs "TILT DOWN", which is key information of the KEY12, to the output unit 26.

In this manner, in the voltage dividing circuits 12a and 12b of the present embodiment described above, a plurality of resistors included in the voltage dividing circuits are connected in parallel, and a plurality of switches for producing a short-circuit between each resistor and the ground point G or between a plurality of resistors and the ground point G are provided. Therefore, more switches are provided in comparison with the conventional voltage dividing circuits 12c and 12d where a plurality of resistors are connected in series.

Consequently, even if a voltage dividing circuit employs the same number of resistors as the conventional circuit, it is possible to generate more kinds of divided voltages than the conventional circuit. Therefore, it is capable of identifying more keys even though the voltage dividing circuit has just the same number of resistors as the conventional circuit. As a result, if the number of keys to be identified increases, it is possible to reduce the cost by suppressing the increase in the number of resistors.

The present invention can employ not only the aforementioned embodiment but also other various embodiments. For example, although the key input device 1 is described as a single device in the above embodiment, it is not limited thereto and the key input device 1 may be incorporated in the equipment such as DVD (Digital Versatile Disc) player as a part thereof.

In addition, in the above embodiment, although the conversion table 25b is formed as shown in FIGS. 4 and 5, it is not limited thereto and the key information may be set arbitrarily with respect to each voltage value.

Furthermore, in the above embodiment, resistance value of each resistor may be set arbitrarily as long as voltage values of the divided voltages (input voltages V1) generated in the voltage dividing circuits 12a and 12b in FIGS. 2 and 3 are not identical mutually.

| Reference Signs List | |
|---|---|
| 1 | key input device |
| 10 | input circuit |
| 11 | power supply |
| 12 | voltage dividing circuit |
| 12a, 12b | voltage dividing circuits |
| 13 | output port |
| 14 | limit resistor |
| 15 | connecting line |
| 16a-18a, 16b-19b | resistors |
| 20 | arithmetic processing circuit |
| 21 | control unit |
| 22 | input port |
| 23 | A/D converter |
| 24 | temporary memory |
| 25 | memory |
| 25a | identification program |
| 25b | conversion table |
| 26 | output unit |
| P1-P9, P11-P38 | connecting points |
| L1-L4, L11-L15 | circuits |
| SW1-SW8, SW11-SW26 | switches |
| G | ground point |
| K | key |

The invention claimed is:

1. A key input device comprising:

a plurality of keys;

a limit resistor whose one end is connected to a power supply; and a voltage dividing circuit connected to the other end of the limit resistor to generate different voltages corresponding to each key when any of the plurality of keys is operated, and identifying the operated key based on the voltage generated by the voltage dividing circuit, wherein the voltage dividing circuit includes a plurality of resistors and a plurality of switches each of which is corresponding to each of the plurality of keys, the plurality of switches are composed of a first switch group and a second switch group, a plurality of circuits each of which has one resistor out of the plurality of resistors and one switch in the first switch group are provided, where the resistor and the switch are connected in series, the plurality of circuits are connected in parallel so that one end thereof is connected to the limit resistor and the other end thereof is grounded, and each circuit in the parallel-connected circuits has a connecting point between the resistor and the switch, one switch in the second switch group is connected between the connecting point in one circuit and the connecting point in another circuit, and each resistor of at least two circuits is connected in parallel by said one switch.

2. A key input device according to claim 1, wherein the plurality of resistors have different resistance values with each other.

* * * * *